(12) United States Patent
Kawanishi et al.

(10) Patent No.: US 7,902,729 B2
(45) Date of Patent: Mar. 8, 2011

(54) PIEZOELECTRIC VIBRATING PIECES AND PIEZOELECTRIC DEVICES

(75) Inventors: Shingo Kawanishi, Saitama (JP); Yu Iwai, Saitama (JP); Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 221 days.

(21) Appl. No.: 12/166,125

(22) Filed: Jul. 1, 2008

(65) Prior Publication Data

US 2009/0009037 A1 Jan. 8, 2009

(30) Foreign Application Priority Data

Jul. 2, 2007 (JP) ................................. 2007-173863

(51) Int. Cl.
*H01L 41/08* (2006.01)
(52) U.S. Cl. ........................... 310/348; 310/344; 310/370
(58) Field of Classification Search .................. 310/244, 310/248, 366, 370
See application file for complete search history.

(56) References Cited

U.S. PATENT DOCUMENTS

| | | | | |
|---|---|---|---|---|
| 3,683,213 A | * | 8/1972 | Staudte | 310/312 |
| 3,697,789 A | * | 10/1972 | Kato et al. | 310/344 |
| 4,191,906 A | * | 3/1980 | Kogure | 310/370 |
| 6,541,897 B2 | * | 4/2003 | Endoh | 310/344 |
| 6,960,870 B2 | * | 11/2005 | Kikushima et al. | 310/344 |
| 7,067,966 B2 | * | 6/2006 | Tanaya | 310/367 |
| 7,279,824 B2 | * | 10/2007 | Tanaya et al. | 310/344 |

FOREIGN PATENT DOCUMENTS

| | | |
|---|---|---|
| EP | 1 528 673 | 5/2005 |
| EP | 1 650 867 | 4/2006 |
| JP | 2001-203560 | 7/2001 |
| JP | 2004 120249 | 4/2004 |
| JP | 2004 266871 | 9/2004 |
| JP | 2004-266871 | 9/2004 |

OTHER PUBLICATIONS

European Search Report, dated Aug. 17, 2009, European Patent Application No. 08159459.

* cited by examiner

*Primary Examiner* — Mark Budd
(74) *Attorney, Agent, or Firm* — Klarquist Sparkman, LLP

(57) ABSTRACT

The piezoelectric vibrating piece (20) comprises a base portion (29) having an adhesive area on a first surface of electrically conductive adhesive 31 for mounting, a pair of vibrating arms (21) extending in a first direction from one edge of the base portion, base electrodes (23a, 25a) arranged in the base portion, an exciting electrode (23c, 25c) extending in a first direction and connecting the base electrode to excite a pair of vibrating arms. The area where the base electrodes (23a, 25a) conduct the electrically conductive adhesive (31) is smaller than the adhesive area (33).

20 Claims, 10 Drawing Sheets

B-B cross section

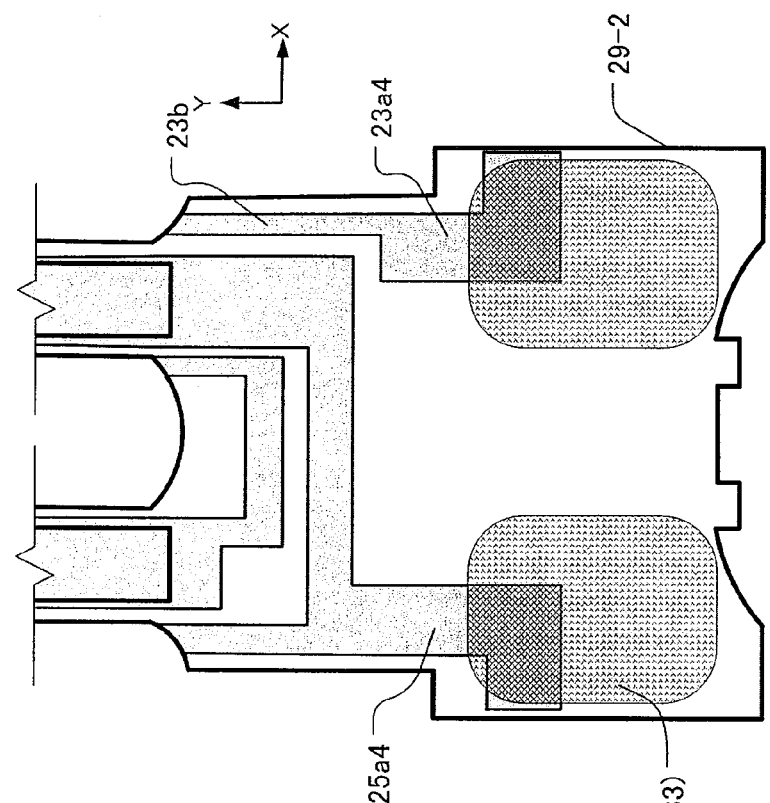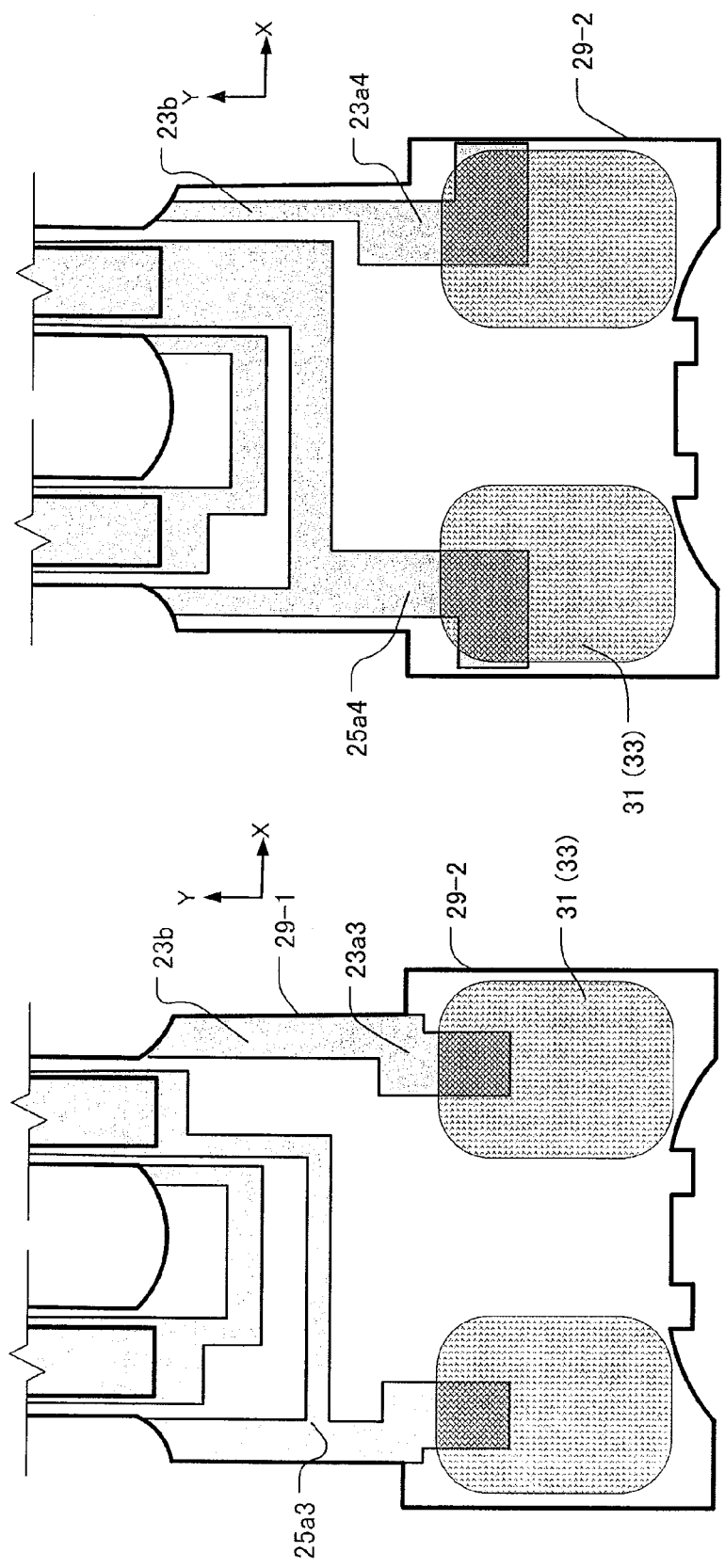
FIG.5A
FIG.5B

PIEZOELECTRIC VIBRATING PIECES AND PIEZOELECTRIC DEVICES

CROSS-REFERENCE TO RELATED APPLICATION

This application claims the benefit of Japanese Patent Application No. 2007-173863 filed on Jul. 2, 2007, in the Japan Patent Office, the disclosure of which is incorporated herein by reference in its entirety.

FIELD

The present invention relates to improvements in piezoelectric vibrating pieces and in piezoelectric devices accommodating the piezoelectric vibrating piece inside a package.

DESCRIPTION OF THE RELATED ART

For small informational devices, such as HDDs (Hard Disc Drives), mobile computers, IC cards, and clock sources for mobile phones, piezoelectric devices such as piezoelectric vibrating pieces or piezoelectric oscillators are being used.

The profile outline of a tuning-fork type piezoelectric vibrating piece as disclosed in Japan Unexamined Patent Application No. 2001-203560 is formed by wet etching a piezoelectric material such as a crystal wafer. In order to lower crystal impedance (CI) value of the tuning-fork type piezoelectric vibrating piece, the relation of width and thickness of its pair of vibrating arms is adjusted. Japan Unexamined Patent Application No. 2004-266871 discloses that, to stabilize the CI value and achieve miniaturization of the tuning-fork type piezoelectric vibrating piece, grooves are formed on the vibrating arms and a notch is formed on the base portion to lower the CI value variability from one piece to the next.

However, as disclosed in Japan Unexamined Patent Application No. 2004-266871, even a tuning-fork type piezoelectric vibrating piece having a notch on the base portion can exhibit a large variability in CI value. Also, compared to a tuning-fork type piezoelectric vibrating piece lacking a notch, the variability of the CI value is not improved. Also, tuning-fork type piezoelectric vibrating pieces exhibiting great variability of one or more temperature characteristics such as zero temperature coefficient (ZTC), are often inadvertently manufactured despite these variables having respective quality standards.

The present invention, therefore, solves the foregoing problems. A purpose of the present invention is to provide piezoelectric vibrating pieces and piezoelectric devices exhibiting improved variability of CI value and of ZTC, while also being miniaturized. However, in some examples, other features and advantages are realized, and other problems may be solved.

SUMMARY

A piezoelectric vibrating piece comprises a piezoelectric material having a first and second surfaces. The piece comprises a base portion on its first surface that includes an "adhesive area" on which electrically conductive adhesive is applied for mounting. The piece also has at least a pair of vibrating arms that extend in a first direction from one end of the base portion. A base electrode is situated on the base portion. An excitation electrode extends in a first direction and connects to the base electrode to allow electrical excitation of the pair of vibrating arms. The area of the base electrode actually conductively bonded to the electrically conductive adhesive is less than the area of the adhesive.

According to a first aspect, even if a piezoelectric vibrating piece is mounted without changing the amount of the electrically conductive adhesive applied to it, the area in which the base electrode conducts to the electrically conductive adhesive is less than the area of adhesive. With such a configuration, the variability of CI value as well as of ZTC is lower than exhibited by conventional pieces. Thus, the yield ratio of defective products is decreased when CI values and ZTC values of a manufacturing lot are checked during manufacture.

In the piezoelectric vibrating piece of a second aspect, the width of the base electrode is narrower than the width of the excitation electrode in a second direction that intersects with the width in the first direction. Accordingly, by making the base electrode narrower than the excitation electrode, the area of the electrically conductive adhesive that is conductively bonded to the electrode can be kept small.

According to a third aspect, the base electrode of the piezoelectric vibrating piece extends from one end of the base portion to only half way to the other end. Accordingly, by making the width of the base electrode extending from the excitation electrode less than of the excitation electrode, the area to be conductively bonded to the electrically conductive adhesive can be small.

According to a fourth aspect, the piezoelectric vibrating piece has a base electrode on the first surface and an electrode on the second surface, wherein the electrodes have different dimensions. It is preferred that the surface of the base electrode, where the electrically conductive adhesive is applied, has a smaller area than the adhesive area in conventional pieces. On the other side, the base electrode can be as large as in conventional pieces. Generally, the base electrode is manufactured by a photolithography process. The other surface can be patterned using the same mask as previously used in the photolithography process.

According to a fifth aspect, the base electrode of piezoelectric vibrating piece comprises a first base electrode and a second base electrode. The adhesive area of electrically conductive adhesive comprises a first adhesive area, corresponding to the first base electrode, and a second adhesive area, corresponding to the second base electrode. The area of the first base electrode in conductive contact with the adhesive is less than the area of the first adhesive area. The area of the second base electrode in conductive contact with the adhesive is smaller than the area of the second adhesive area. Accordingly, since the area of the first base electrode in conductive contact is less than the area of the first adhesive area, and since the area of the second base electrode in conductive contact is less than the area of the second adhesive area, the variabilities of CI value and of ZTC are reduced, compared to a configuration in which only one base electrode has a smaller dimension than the adhesive area.

In a piezoelectric vibrating piece according to a sixth aspect, an insulating layer is formed on the surface of the base electrode. Consequently, the area of the base electrode in contact with electrically conductive adhesive is less than the area of the adhesive. By forming an insulating layer, after a large base electrode has been formed, using a mask previously used in a photolithography step, the base electrode can be made smaller than the area of adhesive in which the base electrode is in electrical contact.

In a piezoelectric vibrating piece according to a seventh aspect the area in which the base electrode is in conductive contact with the electrically conductive adhesive is 1% to 80% of the area of the adhesive. If the conductive area is less than 1%, it can actually excite the piezoelectric vibrating piece. On the other hand, if the conducting area is more than 80%, the difference in areas of the base electrode and adhesive is smaller, compared to configurations in which the base electrode is larger than the adhesive area of the electrically conductive adhesive.

A piezoelectric device according to an eighth aspect comprises the piezoelectric vibrating piece of any of the first to seventh aspects, contained in a package. A cap seals the package. By using a piezoelectric vibrating piece exhibiting low variability of CI and ZTC variability, an improved piezoelectric device is provided. Therefore, less defective products are manufactured, and more of the produced devices output stable and accurate vibrational frequency as a clock source for informational devices such as mobile phones.

The present invention provides piezoelectric vibrating pieces and piezoelectric devices in which the variability of CI value is typically, but not necessarily, lowered. Also, the ZTC variability is generally, but not necessarily, improved.

BRIEF DESCRIPTION OF THE DRAWINGS

FIG. 3A is a top view with the metal cap 56 removed. FIG. 3B is a cross-sectional view taken along the B-B line, with the metal cap 56 attached.

FIG. 5A is an enlarged view of the base portion 29 of a tuning-fork type crystal vibrating piece 20 according to a third embodiment.

FIG. 5B is an enlarged view of the base portion 29 of a tuning-fork type crystal vibrating piece 20 according to a fourth embodiment.

FIG. 6A shows a back surface (the surface to be adhered) of the second base portion 29-2, FIG. 6B shows a front surface.

FIG. 7A shows a back surface of the second base portion 29-2, and FIG. 7B is a cross-sectional view taken along the B-B line of FIG. 7A.

DETAILED DESCRIPTION

Figure 1A:
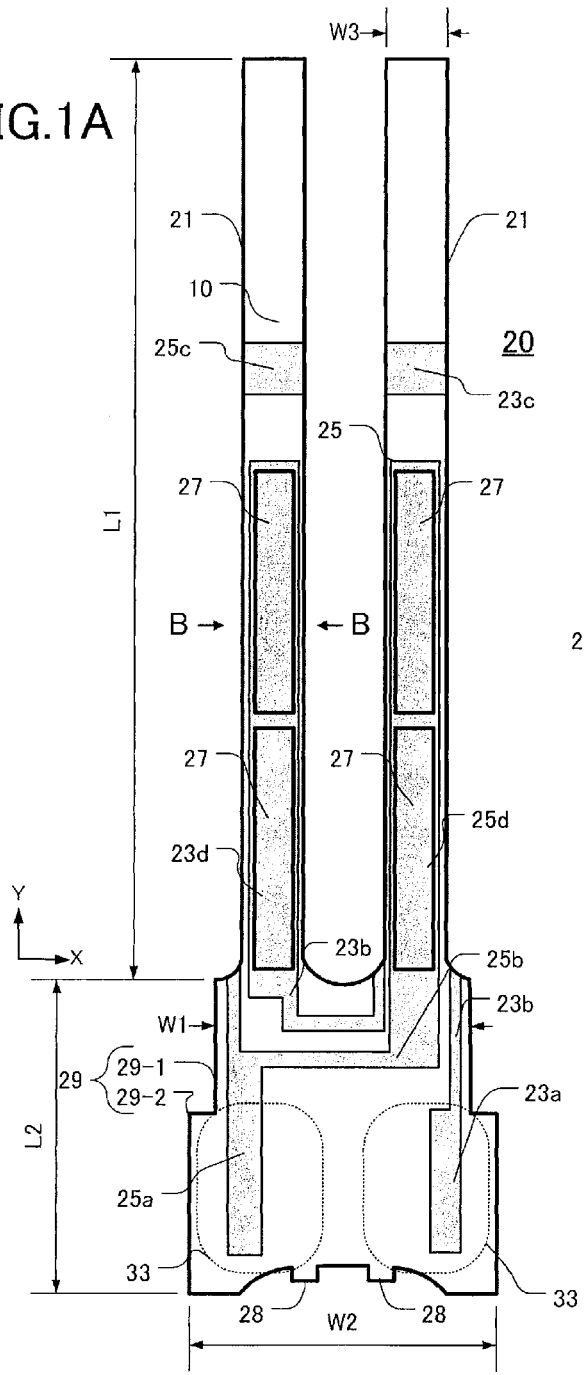
FIG. 1A is a flat view of the tuning-fork type crystal vibrating piece 20 of a first embodiment.
Figure 1B:
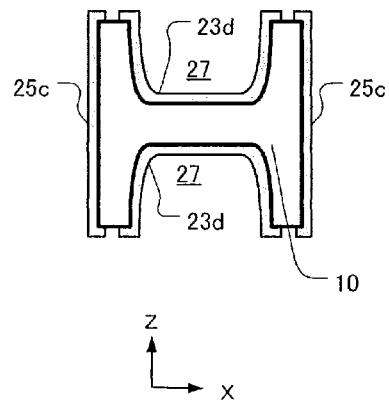
FIG. 1B is a cross-sectional view of a vibrating arm 21 of the piece shown in FIG. 1A taken along the B-B line.

FIG. 1A is a flat view showing an embodiment of a tuning-fork type crystal vibrating piece 20. FIG. 1B is a cross-sectional view taken along the B-B line. The tuning-fork type piezoelectric vibrating piece 20 is formed by cutting a single crystal such as a crystal Z board 10. Besides a crystal, a piezoelectric material such as lithium tantalite or lithium niobate can be used. Also, the tuning-fork type crystal vibrating piece 20 shown in FIGS. 1A-1B is a small vibrating piece that oscillates at 32.768 kH. Such a tuning-fork type crystal vibrating piece 20 has a base portion 29 and a pair of vibrating arms 21 that extends from the base portion 29 in the X direction. On the surface of each vibrating arm 21 are groove portions 27, as shown in FIGS. 1A-1B. The groove portions 27 are also formed on the back surface of each arm 21. As shown in FIG. 1B, a cross-sectional view of the groove portion 27 of the pair of arms 21 is nearly H-shaped. The groove portion 27 serves to control rises in the CI value.

As shown in FIG. 1A, the entire portion of the base portion 29 of the tuning-fork type crystal vibrating piece 20 is formed nearly as a board-shape. The length L2 in the longitudinal direction is, for example, 0.58 mm. The length L1 in the longitudinal direction of each arm 21 from the base portion 20 is about 1.70 mm. Therefore, the length of the base portion 29 relative to the corresponding pair of arms 21 is about 34%. Also, the width W3 of each arm 21 is about 0.12 mm.

The base portion 29 has a first base portion 29-1 on the side of the pair of arms 21 and a second base portion 29-2 on the side of an adhesive area 33. The width in the X direction of the first base portion 29-1 is denoted W1, and the width in the X direction of the second base portion 29-2 is denoted W2, wherein W2 is wider than W1. The width W1 is 75% to 90% of the width W2. For example, the width W1 is 0.42 mm and width W2 is 0.55 mm. So, vibration leakage, from vibration of the arms, 21, through the groove portion 27 is not easily transmitted to the second base portion 29-2.

Also, on the second base portion 29-2, two connecting portions 28 are formed. The two connecting portions 28 are remaining material from when the tuning-fork type crystal vibrating piece 20 was cut from the single crystal wafer. Generally, thousands of tuning-fork type crystal vibrating pieces 20 are connected to a board of single crystal wafer during manufacture.

On each arm 21 and on the base portion 29 of the tuning-fork type crystal vibrating piece 20, a first electrode pattern 23 and a second electrode pattern 25 are formed. Both electrode patterns 23 and 25 have a gold (Au) layer of 400 to 3000 Angstroms formed on a chrome (Cr) layer of 50 to 700 Angstroms. Instead of the chrome (Cr) layer, a tungsten (W) layer or a titanium (Ti) layer can be used, and instead of the gold (Au) layer, a silver (Ag) layer can be used. The layer can alternatively be formed as a single layer such as of aluminum (Al).

On the base portion 29 of the tuning-fork type crystal vibrating piece 20, a first base electrode 23a1 and a second base electrode 25a1 are formed. On the groove portions 27 of each arm 21, a first groove electrode 23d and a second groove electrode 25d are formed. The widths of the first groove electrode 23d and of the second groove electrode 25d are equal to the width W3 of each arm 21. As FIG. 1B shows, on both side surfaces of the left vibrating arm 21, second electrodes 25c are formed. On both side surfaces of the right vibrating arm 21, first electrodes 23c are formed. A first connecting electrode 23b is conductively coupled to the first base electrode 23a1, the first side surface electrode 23c, and the first groove electrode 23d, and a second connecting electrode 25b is formed to conduct a second base electrode 25a1, a second side surface electrode 25c, and the second groove electrode 25d. Electrically conductive adhesive 31 (see FIG.

2) is applied to an adhesive area 33 of the first base electrode 23a1 and of an adhesive area 33 of the second base electrode 25a1.

Figure 2A:
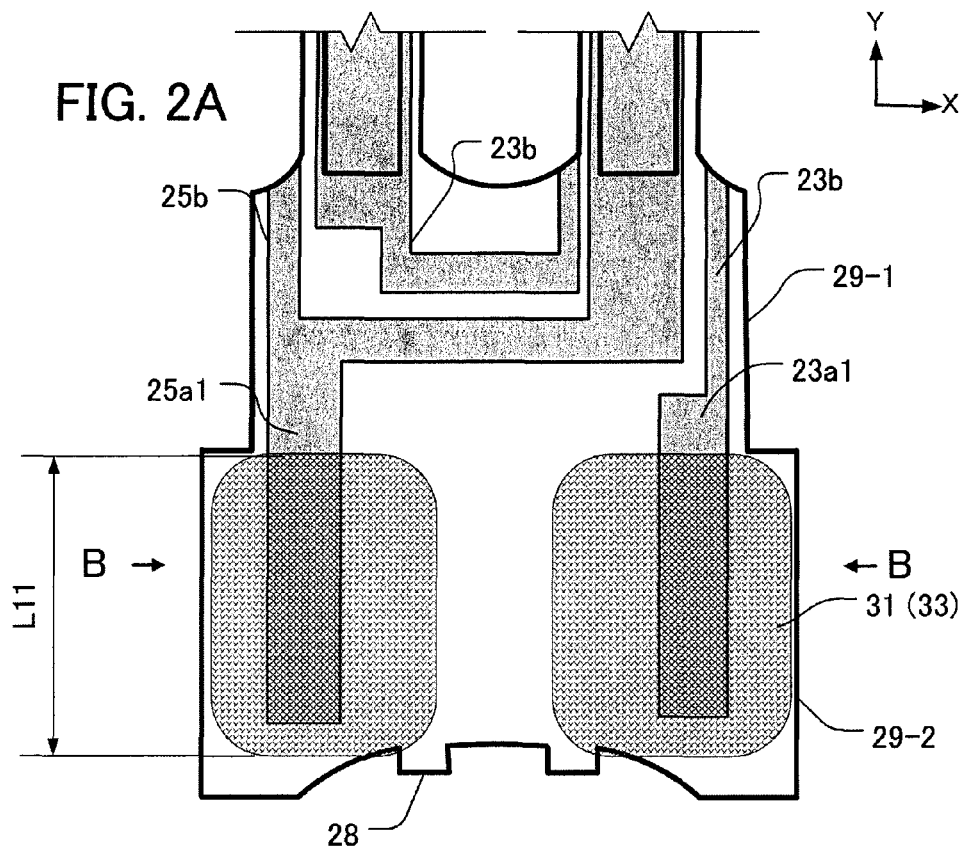
FIG. 2 is an enlarged view of the tuning-fork type crystal vibrating piece 20 shown in FIG. 1.
Figure 2B:
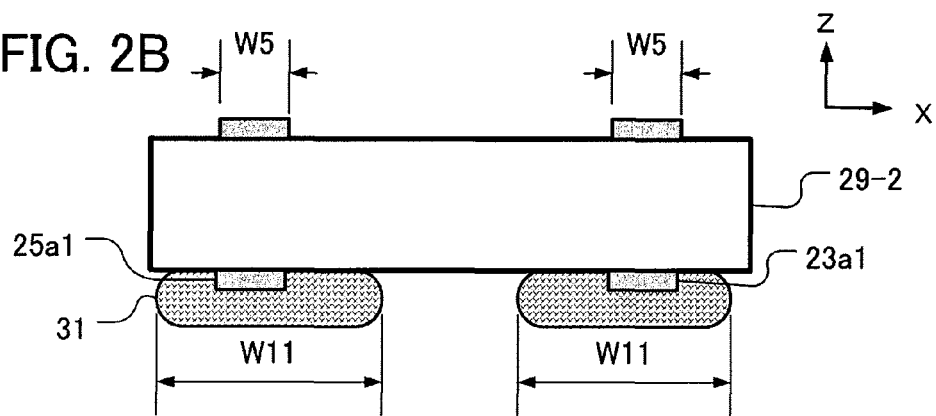

FIG. 2A is an enlarged view of the base portion 29 of the tuning-fork type crystal vibrating piece 20 shown in FIGS. 1A-1B. FIG. 2B is a cross-sectional view taken along the B-B line of FIG. 2A. The first base electrode 23a1 and the second base electrode 25a1 are extended in the longitudinal direction (Y direction) of the second base portion, and the electrode width W5 is formed narrowly within a range of 0.01 mm to 0.10 mm. Then, electrically conductive adhesive 31 is applied from a needle (not shown) to the connecting electrodes (see FIGS. 3A-3B). To distinguish an applied area of electrically conductive adhesive 31 from the areas of the first base electrode 23a1 and of the second base electrode 25a1, the electrically conductive adhesive 31 is shown being applied on the first base electrode 23a1 and the second base electrode 25a1.

The electrically conductive adhesive 31 comprises epoxy, silicone, polyimide, or polyurethane resin as a binder, and conductive filler such as silver, nickel, or carbon. The electrically conductive adhesive 31 is applied on the adhesive area 33 to prevent the tuning fork-type crystal vibrating piece 20 from coming off by impact. The adhesive area of the electrically conductive adhesive 31 has a length L11 that is, for example, about 0.3 mm and a width W11 that is 0.15 to 0.20 mm. If the dimensions of the adhesive are less than these values, the tuning fork-type crystal vibrating piece 20 may come off by impact.

The area of the first base electrode 23a1 and of the second base electrode 25a1 are both about 0.01 mm$^2$, and the corresponding area of the electrically conductive adhesive 31 is about 0.05 mm$^2$. The relative area in which the electrically conductive adhesive 31 conducts to the first base electrode 23a1 and the second base electrode 25a1 is about 20% of the area of adhesive on each electrode. Such a configuration of the first base electrode 23a1 and second base electrode 25a1 relative to the adhesive exhibit low variability of CI value and low ZCT variability.

Figure 3A:
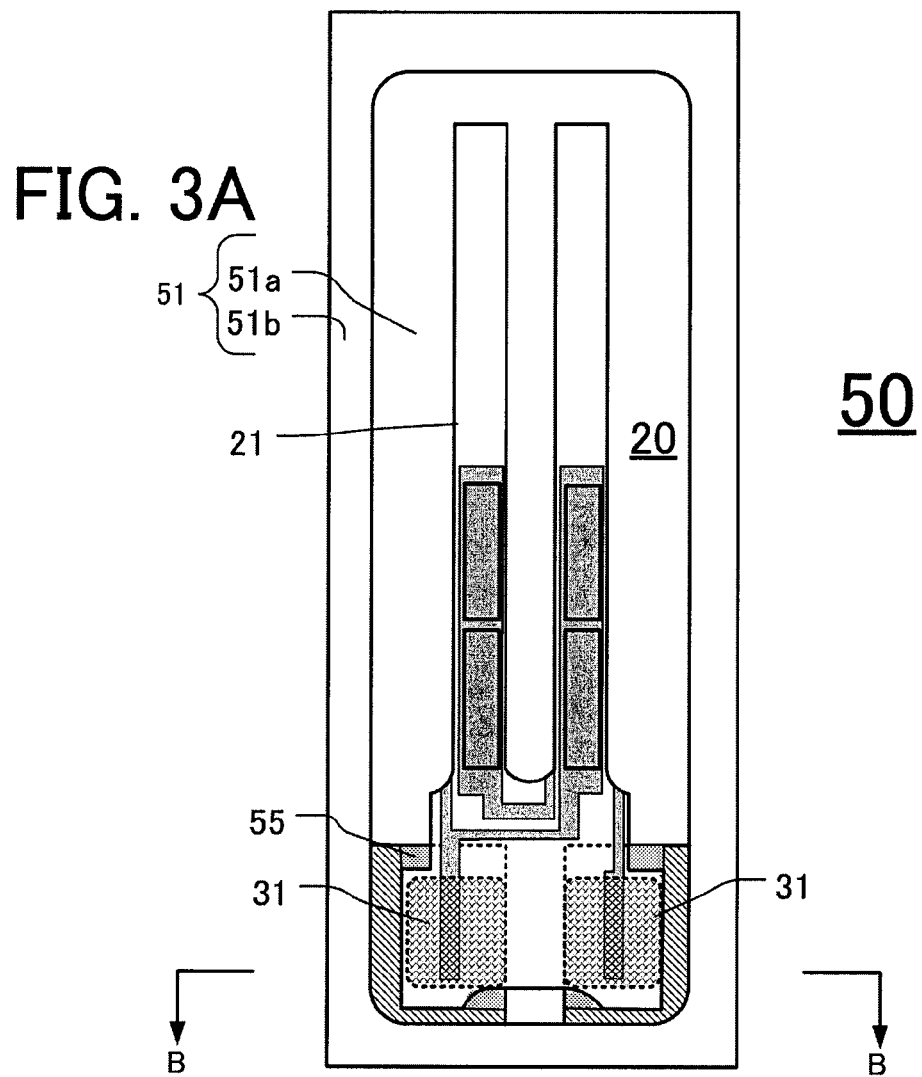
FIGS. 3A-3B show a piezoelectric device 50 in which a tuning-fork type crystal vibrating piece 20 is mounted on a package 51.
Figure 3B:
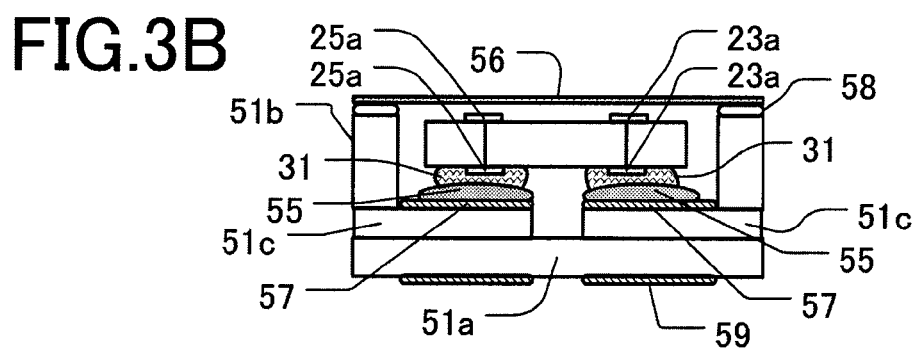

FIGS. 3A-3B show a piezoelectric device 50 in which the tuning-fork type crystal vibrating piece 20 is attached to a package 51. FIG. 3A is a top view after the metal cap 56 is removed, and FIG. 3B is a cross-sectional view taken along the B-B line, with the metal cap 56 still attached. The piezoelectric device 50 comprises a ceramic package 51, which is an insulating material. The tuning-fork type crystal vibrating piece 20 is attached to and sealed in a vacuum inside the package. The package 51 is a laminate of a plurality of ceramic thin boards (51a, 51b, 51c) each formed as a ceramic green sheet made of oxidized aluminum. The package has a box-shaped space inside.

The package 51 (in the vicinity of the base portion 51a thereof) has at least one external terminal 59 formed on a corner of the bottom. A connecting terminal 57 is formed on a step portion 51c and connected to the external terminal 59 via a through-hole (not shown). On the connecting terminal 57 and the external terminal 59, a tungsten-based thick film is metalized by application of a nickel (Ni) layer and gold (Au) layer. Also, a gold bump 55 is applied on the connecting terminal 57.

Then, on the connecting terminal 57, electrically conductive adhesive 31 is discharged from a needle (not shown) onto the gold bump 55. As mentioned above, a sufficient amount of the electrically conductive adhesive 31 is applied to prevent the cantilevered tuning-fork type crystal vibrating piece 20 from coming off. To harden the electrically conductive adhesive 31, it is heated to around 140 C to 300 C. To achieve a full cure, the entire package 51 is put into a furnace at a temperature between 140 C and 300 C with the tuning-fork type crystal vibrating piece 20 being attached by the electrically conductive adhesive 31. Thus, the tuning-fork type crystal vibrating piece 20 is mounted on the package 51. If the electrically conductive adhesive 31 is an ultraviolet-cure adhesive, it is cured by irradiating it with ultraviolet rays from a high-pressure mercury lamp.

On the wall portion 51b, a sealing material 58 is formed. The sealing material 58 is formed by applying a layer of nickel and a layer of gold over a tungsten metalizing layer. Also, on the top of the sealing material 58, a cap 56 is mounted, so the base portion 51a, wall portion 51b, sealing material 58, and cap 56 form a hollow box. If formed of a metal such as kovar, the cap 56 can be fixed to the wall portion 51b by seam welding or other manual manner.

Figure 4A:
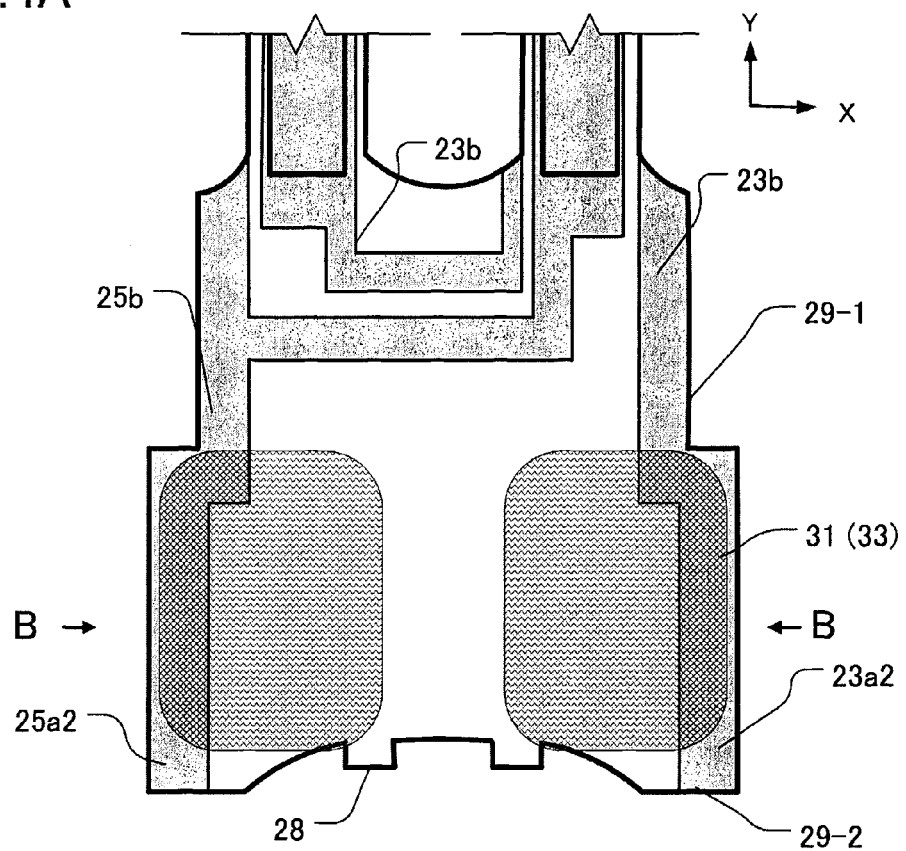
FIG. 4A is an enlarged view of the base portion 29 of a tuning-fork type crystal vibrating piece 20 according to a second embodiment.
Figure 4B:
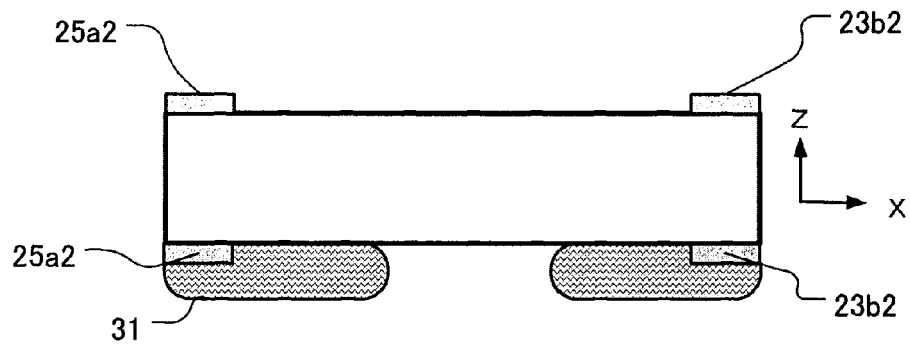
FIG. 4B is a cross-sectional view taken along the B-B line in FIG. 4A.

FIG. 4A is a enlarged view of the base portion 29 of the tuning-fork type crystal vibrating piece 20 of a second embodiment. FIG. 4B is a cross-sectional view taken along the line B-B of FIG. 4A. The first base electrode 23a2 and second base electrode 25a2 are formed on the second base portion 29-2 along respective edges of the second base portion 29-2. The width of each base electrode is narrow, 0.01 mm to 0.10 mm, similar to the first base electrode 23a1 and the second base electrode 25a1 of the first embodiment. Each base electrode is formed narrower than the groove electrode. In FIG. 4, the area where the electrically conductive adhesive 31 is conductive to the first base electrode 23a2 and the second base electrode 25a2 is about 15% of the area of the conductive adhesive. Such a first base electrode 23a2 and second base electrode 25a2 have low CI value variability, and the ZCT variability is low.

FIG. 5A is an enlarged view of the base portion 29 of the tuning-fork type crystal vibrating piece 20 of a third embodiment. FIG. 5B is an enlarged view of the base portion 29 of the tuning-fork type crystal vibrating piece 20 of a fourth embodiment. The width of the first base electrode 23a3 and second base electrode 25a3 formed on the second base portion 29-2 of the third embodiment is narrow, 0.01 mm to 0.10 mm. Each base electrode is formed short in the Y direction. Therefore, in FIG. 5A, the area where the electrically conductive adhesive 31 is conductive to the first base electrode 23a3 and the second base electrode 25a3 is about 7% of the area of the conductive adhesive. Such a first base electrode 23a3 and second base electrode 25a3 have low CI value variability, and the ZCT variability is low.

The first base electrode 23a4 and second base electrode 25a4 formed on the second base portion 29-2 of the fourth embodiment are L-shaped, and the width of each electrode is 0.01 mm to 0.10 mm. In FIG. 5B, the area where the electrically conductive adhesive 31 is conductive to the first base electrode 23a4 and the second base electrode 25a4 is about 10% of the area of the conductive adhesive. Such a first base electrode 23a4 and second base electrode 25a4 have low CI value variability, and the ZCT variability is low.

Figure 6A:
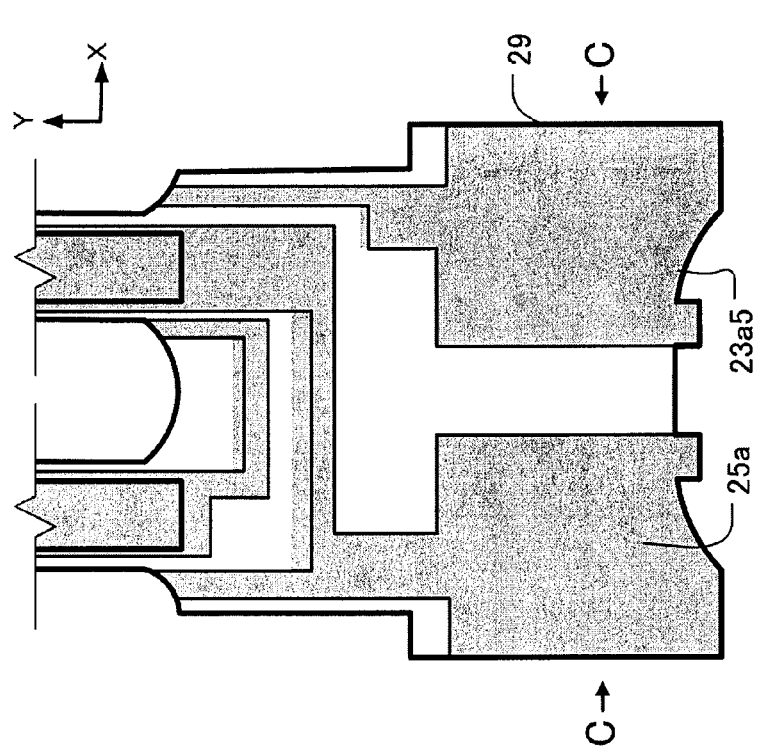
FIGS. 6A-6B are enlarged views showing the second base portion 29-2 of a fifth embodiment.
Figure 6B:
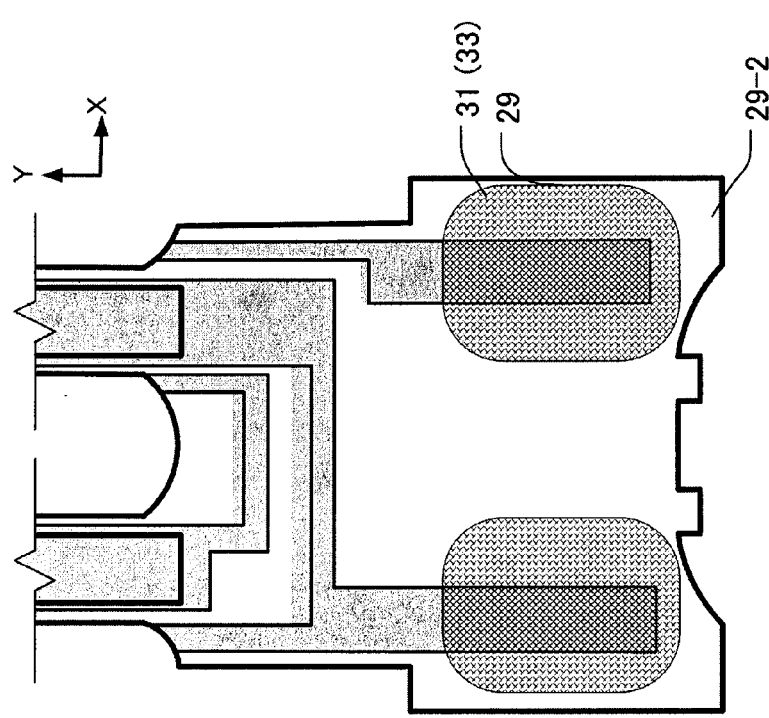
Figure 6C:
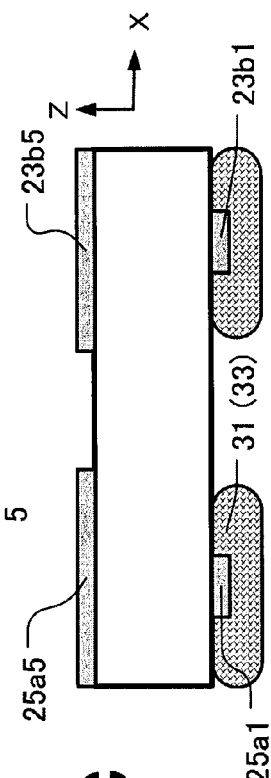
FIG. 6C is a cross-sectional view taken along the C-C line of FIG. 6B.

FIGS. 6A-6B are enlarged views of the second base portion 29-2 of a fifth embodiment. FIG. 6A shows a back surface (the surface to be adhered using the conductive adhesive) of the second base portion 29-2, FIG. 6B shows a front surface, and FIG. 6C shows a cross-sectional view along the C-C line of FIG. 6B. On the second base portion 29-2 of this embodiment, the respective shapes of the base electrodes on the front and back surfaces are different. As FIG. 6A shows, the first base electrode 23a1 and the second base electrode 25a1 have the same shapes as in the first embodiment. On the other hand, as FIG. 6B shows, the first base electrode 23a5 and the second base electrode 25b5 have the same shapes as conventionally. The respective areas of the first base electrode 23a5 and second base electrode 25a5 are larger than the adhesive area 33 of the electrically conductive adhesive 31. The base electrodes are formed by a photolithography step using a mask (not shown. Only for the front surfacecan a mask be used that has been previously used.

As shown in FIG. 6C, the respective areas of contact of the electrically conductive adhesive 31 to the first base electrode 23a1 and second base electrode 25a1 are the same as the first embodiment, so the CI value variability and ZCT variability of the embodiment are reduced.

Figure 7A:
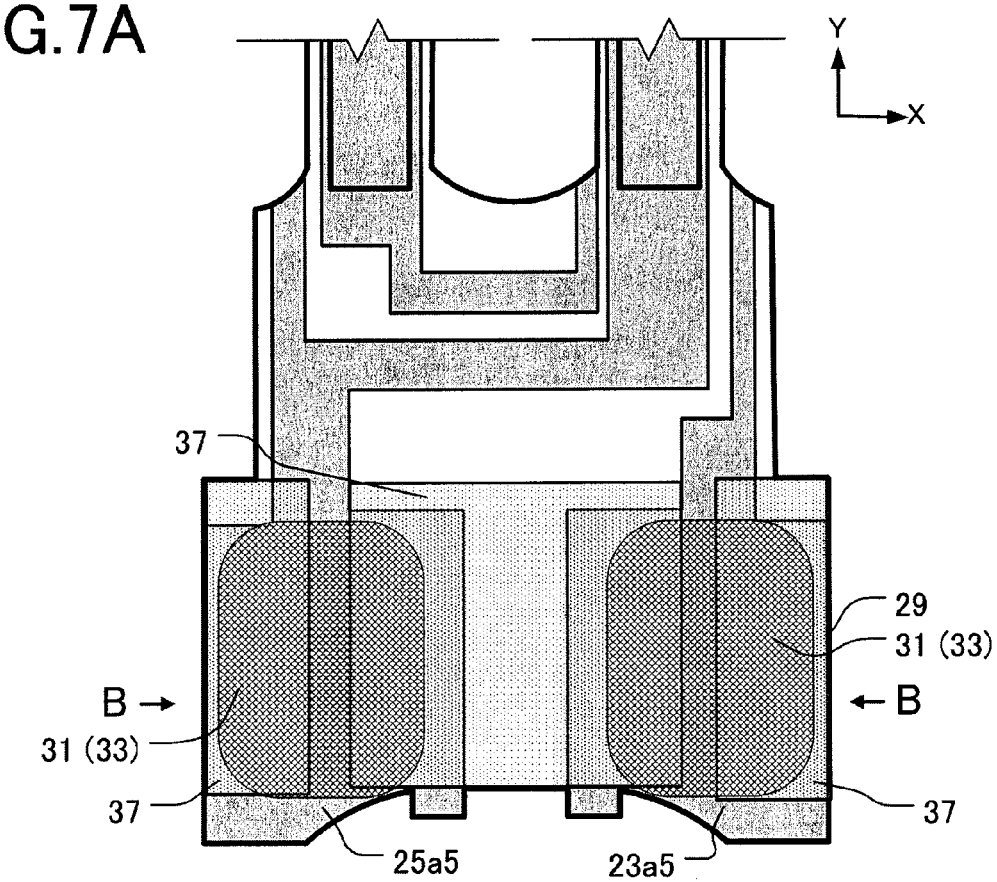
FIGS. 7A-7B are enlarged views showing the second base portion 29-2 of a sixth embodiment.
Figure 7B:
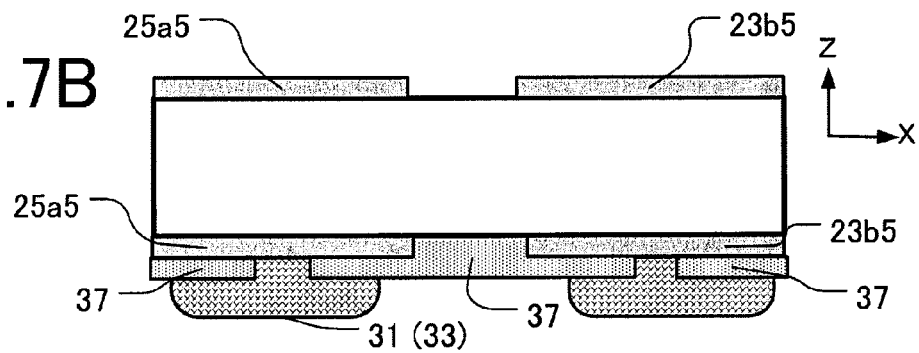

FIGS. 7A-7B are enlarged views of the second base portion 29-2 of a sixth embodiment. FIG. 7A shows a back surface of the second base portion 29-2, and FIG. 7B is a cross-sectional view along B-B line of FIG. 7A. The first base electrode 23a5 and the second base electrode 25a5 have large dimensions, as in the fifth embodiment. If the electrically conductive adhesive 31 is applied to such electrodes, the variability of CI value and ZTC become excessively wide. Therefore, an insulating layer 37 is applied at least on the back surface of the first base electrode 23a5 and the second base electrode 25a5 where the electrically conductive adhesive 31 is applied. The insulating layer 37 is preferably silicon dioxide ($SiO_2$). After the insulating layer 37 is coated, the areas of contact of the electrically conductive adhesive 31 to the first base electrode 23a5 and the second base electrode 25a5 are small. In FIGS. 7A-7B, the area of conduct of the electrically conductive adhesive 31 to the first base electrode 23a5 and the second base electrode 25a5 is about 15% of the adhesive area 33 of the electrically conductive adhesive 31. Thus, the sixth embodiment reduces the variability of CI value and ZTC. The shape of the insulting layer 37 can be any shape so long as the area of conductive contact of the electrically conductive adhesive 31 with the first base electrode 23a5 and the second base electrode 25a5 is small.

Figure 8A:
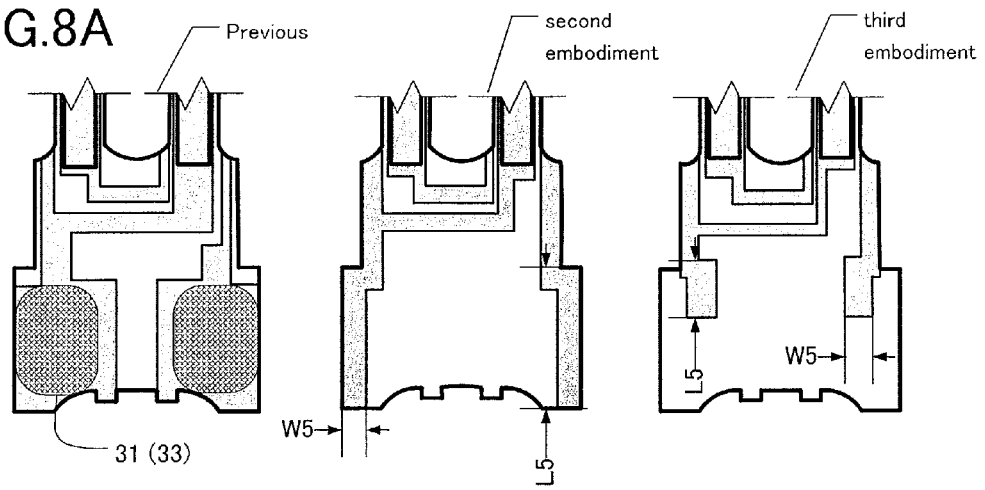
FIG. 8A illustrates a conventional tuning-fork type crystal vibrating piece and two embodiments of tuning-fork type crystal vibrating pieces according to the present disclosure.
Figure 8B:
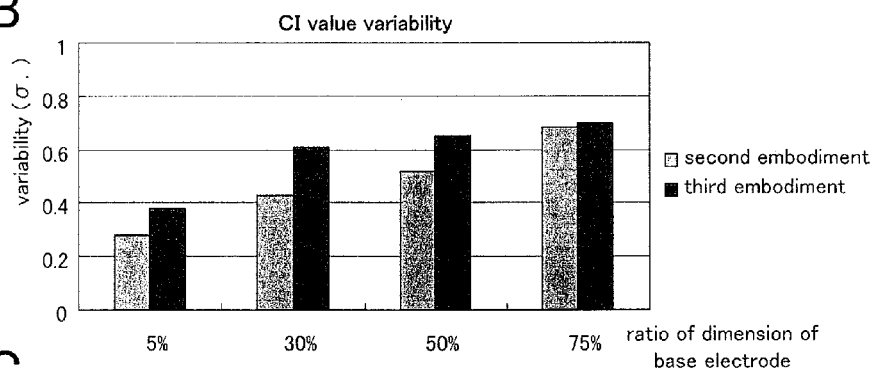
FIGS. 8B-8C are graphs showing research data of the ratios and variability of base-electrode dimensions to corresponding dimensions of electrically conductive adhesive, especially with regard to CI value and ZTC.
Figure 8C:
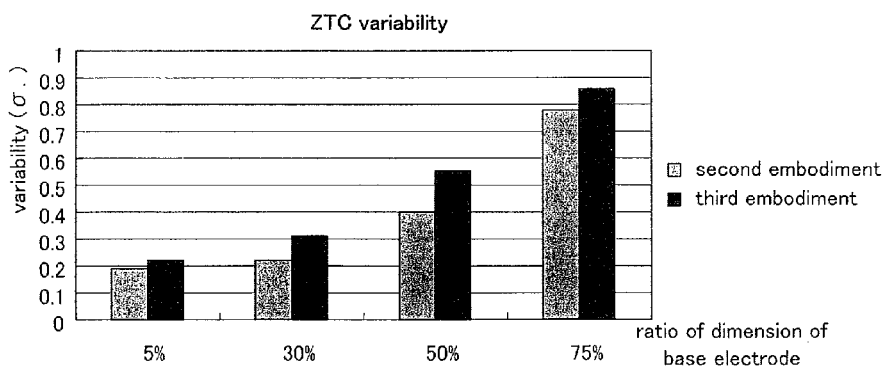

FIGS. 8A-8C show research data obtained with the tuning-fork type crystal vibrating pieces 20 of the second embodiment and of the third embodiment, regarding CI value and ZTC variability. The test population was thirty pieces. The figure on the left of FIG. 8A shows a conventional tuning-fork type crystal vibrating piece having wide base electrodes 25a5 on both surfaces. The figure at the center is the tuning-fork type crystal vibrating piece of the second embodiment, in which the base electrode 25a2 is at least on one surface. The figure on the right shows the tuning-fork type crystal vibrating piece of the second embodiment, in which the base electrode 25a3 is at least on one surface. In order to show the area in which the electrically conductive adhesive 31 is applied, the adhesive area 33 is shown only on the base portion of the conventional tuning-fork type crystal vibrating piece. But, the same amount and area of electrically conductive adhesive 31 is also applied to tuning-fork type crystal vibrating pieces of the second and third embodiments.

FIG. 8B is a graph showing the change of CI value of the base electrode 25a2 of the second embodiment and of the base electrode 25a3 of the third embodiment. The variability (standard deviation σ) is shown on the vertical axis, and the dimensional ratio of the base electrode versus corresponding dimensions of the electrically conductive adhesive 31 are on the horizontal axis. Note that, by changing the length L5 and width W5 of the base electrode 25a2 or 25b3, the dimensional ratio of the base electrode relative to the electrically conductive adhesive 31 is changed to 5%, 30%, 50% and 75%.

FIG. 8C is a graph showing the change of ZCT of the base electrode 25a2 of the second embodiment and of the base electrode 25a3 of the third embodiment. The variability (standard deviation σ) is shown on the vertical axis and the dimensional ratios of the base electrode relative to corresponding dimensions of the electrically conductive adhesive 31 are shown on the horizontal axis.

The conventional tuning-fork type crystal vibrating piece has a CI variability of 2.5 and a ZCT variability of 1.3. On the other hand, with the tuning-fork type crystal vibrating piece 20 of the second and third embodiments, as the dimensional ratio of the base electrode versus the corresponding dimensions of the electrically conductive adhesive 31 is reduced, the variability of CI value and variability of ZTC are reduced as well. Especially the base electrode 25a3 of the second embodiment exhibits very low CI value variability and ZCT variability.

So long as the area of conductive contact of adhesive with the base electrodes is more than 1%, the tuning-fork type crystal vibration piece 20 can actually be excited, so the minimum limit of the dimensional ratio of the base electrode versus the electrically conductive adhesive 31 is 1%. If the dimensional ratio of the base electrode versus the electrically conductive adhesive 31 is more than 80%, especially the variability of ZCT of the third embodiment reaches 1.0 and the difference becomes smaller compared to the conventional base electrode. So, the maximum limit of the dimension ratio of the base electrode versus the electrically conductive adhesive 31 is 80%.

As is shown by FIGS. 8B and 8C, a dimensional ratio of 5% to 50% for the base electrode versus the electrically conductive adhesive 31 is preferable.

Figure 9:
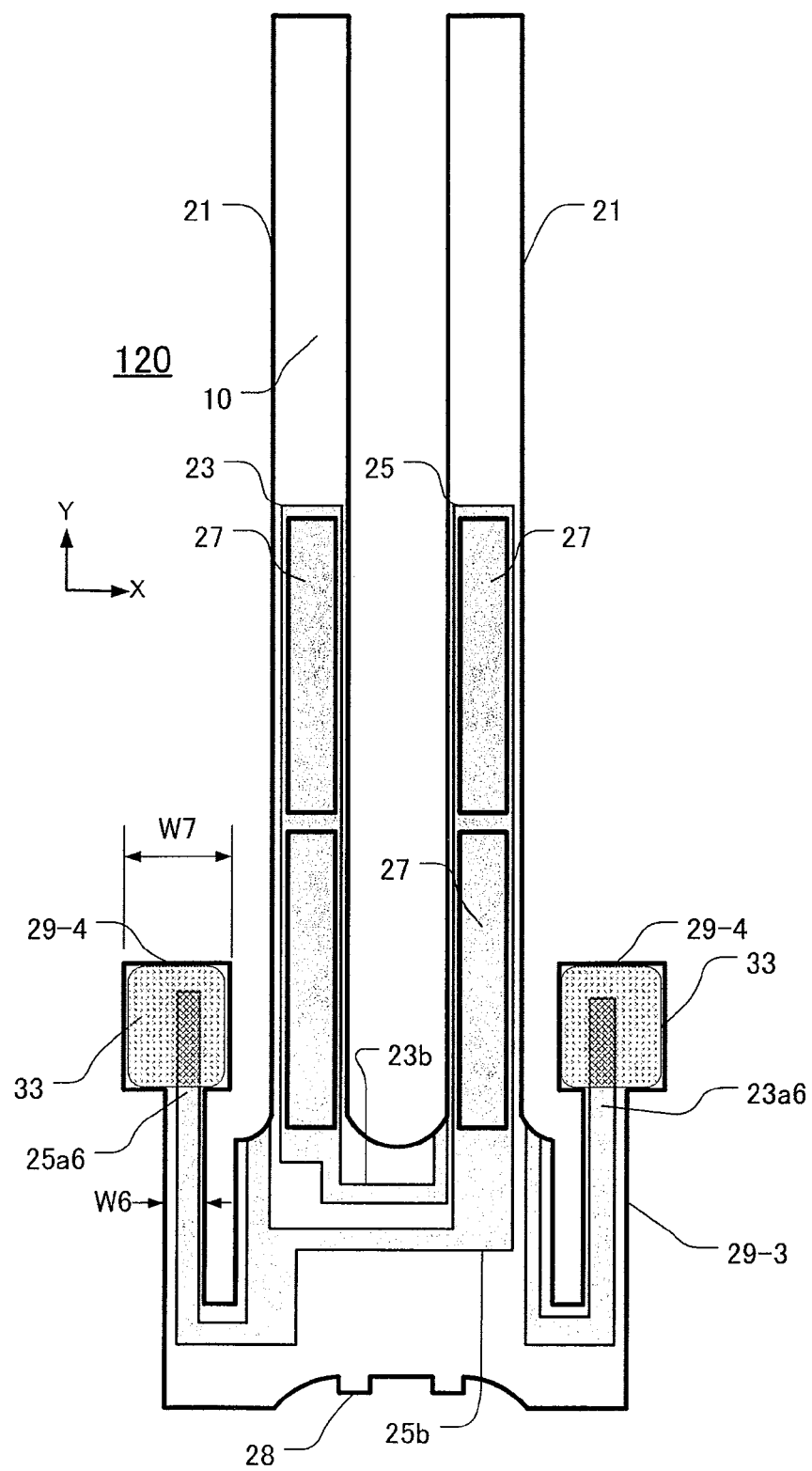
FIG. 9 is a plan view of showing an embodiment of the second tuning-fork type crystal vibrating piece 120.

FIG. 9 is a plan view showing an embodiment of a second tuning-fork type crystal vibrating piece 120. The same components of this configuration use the same reference numbers used in FIG. 1A and others. The second tuning-fork type crystal vibrating piece 120 has a smaller base portion 29, and the length in the Y direction can be less than of the first tuning-fork type crystal vibrating piece 20. The second tuning-fork type crystal vibrating piece 120 is formed by cutting a single crystal wafer configured as a crystal board 10. The second tuning-fork type crystal vibrating piece 120 comprises a pair of supporting arms 29-3. The supporting arms 29-3 first extend in the width direction of the base portion 29 relative to the two connection portions 28, then extend parallel to and outboard of the pair of vibrating arms 21 past the location at which the vibrating arms 21 are attached to the base portion 29. The electrode width W6 of each supporting arm 29-3 is about 0.05 mm to 0.08 mm, which is narrow. At the termination of each supporting arm 29-3, a broad area 29-4 for conductive adhesive is formed. The electrode width W7 of the broad area 29-4 is 0.14 to 0.20 mm. The plan profile of the second tuning-fork type crystal vibrating piece 120 is formed precisely by wet etching a single-crystal wafer.

Even if the size of the base portion 29 of the second tuning-fork type crystal vibrating piece is small, supporting arm 29-3 is located a designated distance from the respective vibrating arm 21. As a result, vibration leakage from the vibrating arms 21 does not propagates to the broad areas 29-4. To support the second tuning-fork type crystal vibrating piece 120, the illustrated adhesive area 33 is necessary.

On the base portion 29 of the second tuning-fork type crystal vibrating piece 120, a first base electrode 23a6 and a second base electrode 25a6 are formed. The first base electrode 23a6 and the second base electrode 25a6 are about 0.01 mm to 0.10 mm, and they are formed narrowly. In FIG. 9, the area of the electrically conductive adhesive 31 in conductive contact with the first base electrode 23a6 and the second base electrode 25a6 is about 10% per base electrode. Such first base electrode 23a6 and second base electrode 25a6 have low CI value variability and low ZCT variability.

Figure 10A:
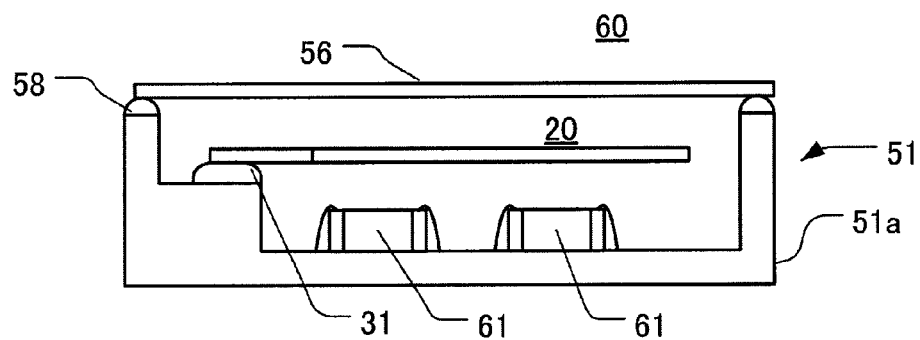
FIG. 10A shows a tuning-fork type crystal oscillator 60.

FIG. 10A shows a tuning-fork type crystal oscillator 60, which is a packaged form of the tuning-fork type crystal vibrating piece 20 or the second tuning-fork type crystal vibrating piece 120 of any of the foregoing embodiments. The tuning-fork type crystal oscillator 60 has many configurations in common with the piezoelectric device 50 shown in FIGS. 3A-3B. Therefore, regarding the same configuration of the piezoelectric oscillator 50, the same reference numbers are used and their explanations are omitted. Also, other piezoelectric devices can be explained with reference to the tuning-fork type crystal vibrating piece 20.

The tuning-fork type crystal oscillator 60 shown in FIG. 10A has integrated circuits 61 mounted to a base portion 51a beneath the tuning-fork type crystal vibrating piece 20. That is, in the tuning-fork type crystal oscillator 60, when the tuning-fork type crystal vibrating piece 20 inside the package vibrates, the vibration is input to the internal integrated circuits 61. By extracting the designated frequency signal, the oscillator provides a usable oscillation. The integrated circuits 61 are mounted on the package 51, and the tuning-fork type crystal vibrating piece 20 is mounted on the package 51 using the electrically conductive adhesive 31.

Figure 10B:
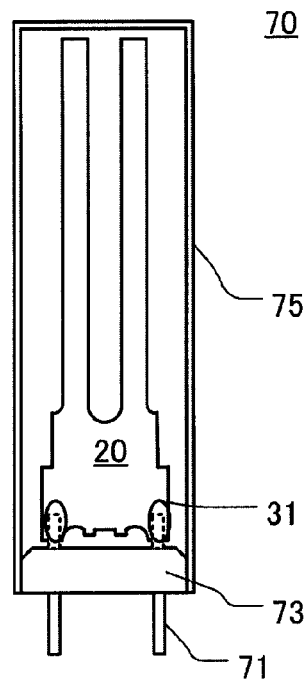
FIG. 10B is a schematic view of the cylinder type tuning-fork vibrator 70.

FIG. 10B is a schematic view of a cylinder type tuning-fork crystal oscillator 70. The cylinder type tuning-fork crystal oscillator 70 includes the above-mentioned tuning-fork type crystal vibrating piece 20. The cylinder type tuning-fork crystal oscillator 70 has a metal cap 75 to contain the tuning-fork type crystal vibrating piece 20 inside. The metal cap is pressed into a stem 73, and the inside of the cap is kept in a vacuum state. Also, two leads 71 are arranged to hold the tuning-fork type crystal vibrating piece 20 in the cap 75. The leads 71 are connected to the tuning-fork type crystal vibrating piece 20 conductively using the electrically conductive adhesive 31. The tuning-fork type crystal vibrating piece 20 vibrates whenever stable current is provided from an electrical circuit.

The present invention is not limited to the foregoing embodiments. The configurations of each embodiment can be combined accordingly. Also, the tuning-fork type crystal vibrating piece 20 or the second tuning-fork type crystal vibrating piece 120 comprises a pair of vibrating arms 21, but the number of vibrating arms can be three or more instead of only two. Moreover, the foregoing embodiments show that the dimension of the first base electrode 23a or the second base electrode 25a is smaller than the adhesive area 33 of the electrically conductive adhesive 31 to be applied to each electrode. However, when the area of the first base electrode 23a is larger than the corresponding adhesive area 33, and when the combined areas of the first base electrode 23a and of the second base electrode 25a are less than combined areas of two of the adhesive areas 33, the CI value variability and ZTC variability can be small.

What is claimed is:

1. A piezoelectric vibrating piece comprised of a piezoelectric material having a first surface and a second surface, comprising:
   a base portion having an adhesive area on the first surface, in which adhesive area a corresponding area of electrically conductive adhesive is situated for mounting the base portion;
   at least a pair of vibrating arms extended in a first direction from one end of the base portion;
   a base electrode arranged on the base portion; and
   an exciting electrode extended in the first direction connecting the base electrode to excite the pair of vibrating arms, wherein the adhesive area includes a first area portion in which the base electrode contacts the electrically conductive adhesive and a second area portion in which the base electrode does not contact the electrically conductive adhesive, wherein the first area portion is smaller than the second area portion.

2. The piezoelectric vibrating piece of claim 1, wherein:
   the base electrode and exciting electrode have respective widths measured in a second direction that is not parallel to the first direction; and
   the width of the base electrode is narrower than the width of the exciting electrode.

3. The piezoelectric vibrating piece according to claim 2, wherein:
   the base electrode comprises a first base electrode portion on the first surface and a second base electrode portion on the second surface; and
   respective dimensions of the first base electrode portion and respective dimensions of the second base electrode portion are different.

4. The piezoelectric vibrating piece according to claim 2, wherein:
   the base electrode is comprised of a first base electrode and a second base electrode;
   with respect to each of the first and second base electrodes, the respective adhesive area of the electrically conductive adhesive is comprised of a first adhesive area corresponding to and contacting the first base electrode and a second adhesive area corresponding to and contacting the second base electrode, and
   the first adhesive area has a respective conduction area in which the first base electrode is situated in contact with the first adhesive area and a respective non-conduction area in which the first base electrode is not situated, and the second adhesive area has a respective conduction area in which the second base electrode is situated in contact with the second adhesive area and a respective non-conduction area in which the second base electrode is not situated.

5. The piezoelectric vibrating piece according to claim 2, wherein:
   the base electrode has a conduction area in conductive contact with the first area portion of the electrically conductive adhesive; and
   the conduction area of the base electrode is 1% to 80% of the adhesive area.

6. The piezoelectric vibrating piece of claim 1, wherein the first area portion extends along a direction perpendicular to the first direction.

7. The piezoelectric vibrating piece according to claim 6, wherein:
   the base electrode comprises a first base electrode portion on the first surface and a second base electrode portion on the second surface; and
   respective dimensions of the first base electrode portion and respective dimensions of the second base electrode portion are different.

8. The piezoelectric vibrating piece according to claim 7, wherein:
   the base electrode has a conduction area in conductive contact with the first area portion of the electrically conductive adhesive; and
   the conduction area of the base electrode is 1% to 80% of the adhesive area.

9. The piezoelectric vibrating piece according to claim 6, wherein:
   the base electrode is comprised of a first base electrode and a second base electrode;

with respect to each of the first and second base electrodes, the respective adhesive area of the electrically conductive adhesive is comprised of a first adhesive area corresponding to and contacting the first base electrode and a second adhesive area corresponding to and contacting the second base electrode; and the first adhesive area has a respective conduction area in which the first base electrode is situated in contact with the first adhesive area and a respective non-conduction area in which the first base electrode is not situated, and the second adhesive area has a respective conduction area in which the second base electrode is situated in contact with the second adhesive area and a respective non-conduction area in which the second base electrode is not situated.

10. The piezoelectric vibrating piece according to claim 6, wherein:

the base electrode has a conduction area in conductive contact with the first area portion of the electrically conductive adhesive; and the conduction area of the base electrode is 1% to 80% of the adhesive area.

11. The piezoelectric vibrating piece according to claim 1, wherein:

the base electrode comprises a first base electrode portion on the first surface and a second base electrode portion on the second surface; and respective dimensions of the first base electrode portion and respective dimensions of the second base electrode portion are different.

12. The piezoelectric vibrating piece according to claim 11, wherein:

the base electrode is comprised of a first base electrode and a second base electrode;

with respect to each of the first and second base electrodes, the respective adhesive area of the electrically conductive adhesive is comprised of a first adhesive area corresponding to and contacting the first base electrode and a second adhesive area corresponding to and contacting the second base electrode, and the first adhesive area has a respective conduction area in which the first base electrode is situated in contact with the first adhesive area and a respective non-conduction area in which the first base electrode is not situated, and the second adhesive area has a respective conduction area in which the second base electrode is situated in contact with the second adhesive area and a respective non-conduction area in which the second base electrode is not situated.

13. The piezoelectric vibrating piece according to claim 12, wherein:

the base electrode has a conduction area in conductive contact with the first area portion of the electrically conductive adhesive; and the conduction area of the base electrode is 1% to 80% of the adhesive area.

14. The piezoelectric vibrating piece according to claim 11, wherein:

the base electrode has a conduction area in conductive contact with the first area portion of the electrically conductive adhesive; and the conduction area of the base electrode is 1% to 80% of the adhesive area.

15. The piezoelectric vibrating piece according to claim 1, wherein:

the base electrode is comprised of a first base electrode and a second base electrode;

with respect to each of the first and second base electrodes, the respective adhesive area of the electrically conductive adhesive is comprised of a first adhesive area corresponding to and contacting the first base electrode and a second adhesive area corresponding to and contacting the second base electrode; and the first adhesive area has a respective conduction area in which the first base electrode is situated in contact with the first adhesive area and a respective non-conduction area in which the first base electrode is not situated, and the second adhesive area has a respective conduction area in which the second base electrode is situated in contact with the second adhesive area and a respective non-conduction area in which the second base electrode is not situated.

16. The piezoelectric vibrating piece according to claim 15, wherein:

the base electrode has a conduction area in conductive contact with the first area portion of the electrically conductive adhesive; and the conduction area of the base electrode is 1% to 80% of the adhesive area.

17. The piezoelectric vibrating piece of claim 1, wherein:

the base electrode has a conduction area in conductive contact with the first area portion of the electrically conductive adhesive; and the conduction area of the base electrode is 1% to 80% of the adhesive area.

18. A piezoelectric device comprising:

the piezoelectric vibrating piece according to claim 1;

a package accommodating the piezoelectric vibrating piece; and a cap sealing the package.

19. A piezoelectric vibrating piece comprised of a piezoelectric material having a first surface and a second surface, comprising:

a base portion having an adhesive area in which a corresponding area of electrically conductive adhesive is situated for mounting the base portion;

at least a pair of vibrating arms extended in a first direction from one end of the base portion;

a base electrode arranged on the base portion; and an exciting electrode extended in a first direction connecting the base electrode to excite the pair of vibrating arms;

wherein the base electrode has an area contacting the electrically conductive adhesive, the area being defined by an insulating layer formed on the surface of the base electrode and situated between the base electrode and the adhesive area.

20. The piezoelectric vibrating piece according to claim 19, wherein:

the base electrode has a conduction area in conductive contact with the first area portion of the electrically conductive adhesive; and the conduction area of the base electrode is 1% to 80% of the adhesive area.

* * * * *

UNITED STATES PATENT AND TRADEMARK OFFICE
CERTIFICATE OF CORRECTION

| | |
|---|---|
| PATENT NO. | : 7,902,729 B2 |
| APPLICATION NO. | : 12/166125 |
| DATED | : March 8, 2011 |
| INVENTOR(S) | : Kawanishi et al. |

It is certified that error appears in the above-identified patent and that said Letters Patent is hereby corrected as shown below:

Column 1, line 59, "having a first" should read --having first--

Column 2, line 24, "less than of the" should read --less than that of the--

Column 2, line 32, "has a smaller" should read --have a smaller--

Column 3, line 58, "view of showing" should read --view showing--

Column 4, line 21, "base portion 20" should read --base portion 20--

Column 5, line 38, "ZCT" should read --ZTC--

Column 6, lines 31, 45, and 59 "ZCT" should read --ZTC--

Column 6, line 66, "base electrode $25b5$" should read --base electrode $25a5$--

Column 7, line 4, "(not shown." should read --(not shown).--

Column 7, line 4, "surfacecan" should read --surface can--

Column 7, lines 9 and 64 "ZCT" should read --ZTC--

Column 8, lines 5, 12, 21, and 67 "ZCT" should read --ZTC--

Column 8, line 34, "less than of the" should read --less than that of the--

Column 8, line 55, "propagates" should read --propagate--

Signed and Sealed this
Sixteenth Day of August, 2011

David J. Kappos
*Director of the United States Patent and Trademark Office*